United States Patent
Ovshinsky et al.

(10) Patent No.: US 6,967,344 B2
(45) Date of Patent: Nov. 22, 2005

(54) MULTI-TERMINAL CHALCOGENIDE SWITCHING DEVICES

(75) Inventors: Stanford R. Ovshinsky, Bloomfield Hills, MI (US); Boil Pashmakov, Troy, MI (US)

(73) Assignee: Energy Conversion Devices, Inc., Rochester Hills, MI (US)

(*) Notice: Subject to any disclaimer, the term of this patent is extended or adjusted under 35 U.S.C. 154(b) by 192 days.

(21) Appl. No.: 10/384,994

(22) Filed: Mar. 10, 2003

(65) Prior Publication Data

US 2004/0178401 A1   Sep. 16, 2004

(51) Int. Cl.⁷ .............................. H01L 47/00
(52) U.S. Cl. .............. 257/2; 257/3; 257/4; 257/5; 257/30; 257/31; 257/246; 257/392; 257/395; 257/596; 257/759; 257/260
(58) Field of Search ........................ 252/4, 5, 2, 3, 252/211, 516; 257/2, 3, 4, 5, 30, 246, 392, 257/395, 396, 759, 760

(56) References Cited

U.S. PATENT DOCUMENTS

2004/0140523 A1 * 7/2004 Hudgens et al. ............ 257/528

* cited by examiner

Primary Examiner—Nathan J. Flynn
Assistant Examiner—Fazli Erdem
(74) Attorney, Agent, or Firm—Kevin L. Bray; Marvin S. Siskind (57) ABSTRACT

Multi-terminal electronic switching devices comprising a chalcogenide material switchable between a resistive state and a conductive state. The devices include a first terminal, a second terminal and a control terminal. Application of a control signal to the control terminal modulates the conductivity of the chalcogenide material between the first and second terminals and/or the threshold voltage required to switch the chalcogenide material between the first and second terminals from a resistive state to a conductive state. The devices may be used as interconnection devices or signal providing devices in circuits and networks.

30 Claims, 6 Drawing Sheets

MULTI-TERMINAL CHALCOGENIDE SWITCHING DEVICES

FIELD OF THE INVENTION

This invention relates generally to electronic switching devices. More particularly, this invention relates to chalcogenide switching devices. Most particularly, this invention pertains to multi-terminal switching devices in which the application of a control signal at a control terminal modulates the threshold voltage and/or conductivity of a chalcogenide material between non-control terminals.

BACKGROUND OF THE INVENTION

Today's electronic devices rely on conventional silicon technology. With silicon technology, one can fabricate the electronic components (e.g. transistors, diodes, switches, memory, integrated circuits and processors) needed to produce modern computers and consumer electronic products. Silicon-based electronics have been remarkably successful in the market place and have provided a number of conveniences that have greatly simplified everyday life.

The growth of silicon-based electronics over the past few decades has been propelled by the enormous strides that have been made in the miniaturization of devices during manufacturing. Miniaturization trends have faithfully followed Moore's Law for many years over many generations of silicon technology. As device feature sizes decrease, it becomes possible to include ever more devices in a given area of a silicon wafer and to achieve improved performance and speed from computers and electronic products.

Since future improvements in computing power and functionality are currently predicated on further improvements in silicon technology, there has been much recent discussion about the prognosis for continued miniaturization of silicon-based electronic devices. A growing consensus is emerging that believes that the computer industry is rapidly approaching the performance limits of silicon. The feature size in today's manufacturing technologies is 0.18 micron and it is expected that this can be reduced to about 0.10 micron in the future. Further decreases in feature size, however, are deemed problematic because sizes below about 0.10 micron lead to a change in the fundamental behavior of silicon. More specifically, as the dimensions of silicon devices decrease to tens of nanometers and below, silicon enters the quantum regime of behavior and no longer functions according to the classical physics that governs macroscopic objects. In the quantum regime, energy states are quantized rather than continuous and phenomena such as tunneling lead to delocalization of electrons across many devices. Consequences of tunneling include leakage of current as electrons escape from one device to neighboring devices and a loss of independence of devices as the state of one device influences the state of neighboring devices. In addition to fundamental changes in the behavior of silicon, further decreases in the dimensions of silicon devices also pose formidable technological challenges. New innovations in fabrication methods such as photolithography will be needed to achieve smaller feature sizes.

Two other drawbacks of silicon technology have been identified. First, the costs of installing and operating new manufacturing facilities have increased exponentially as feature sizes have decreased. At today's 0.18 micron feature size, for example, the cost of building a new semiconductor fabrication facility exceeds a billion dollars. This cost will only increase as devices become smaller and more susceptible to impurities and process contamination. Second, there is growing recognition that the functionality of silicon-based computers is inherently limited as certain computations remain largely unamenable to solution by modern computers. Examples include factoring, parallel computing, pattern recognition and associative memory. Similarly, many tasks that are readily and intuitively performed by humans and other biological organisms are difficult, cumbersome and oftentimes impossible to implement with conventional computers.

Consideration of the future of computing indicates a need for new computers with new functionality to address ever more sophisticated applications. New computers that are adaptable and flexible and that operate according to reasoning and intelligence are needed. A need exists for computers that are not limited to the rigid, brute force problem solving methodology of conventional computers. Instead, computers are needed that can respond to changing situations with an ability to discriminate information from multiple sources to provide reasoned outputs, even in the face of seemingly conflicting circumstances. The functionality required to achieve intelligent computers and devices extends beyond the current and projected performance capabilities of the silicon technology underlying conventional computers. Consequently, a need exists for a new and revolutionary computing paradigm that encompasses general purpose computers and task-specific computing devices as well as their underlying electronic components and materials.

SUMMARY OF THE INVENTION

The instant invention provides electronic switching devices that can be used in the construction of novel computers and computing devices having greater functionality than today's conventional computers. The instant devices are not based on silicon, but rather on chalcogenide phase change materials that can be reversibly transformed between resistive and conductive states. Transformations between states are effected by providing energy to the phase change material in an amount meeting or exceeding a threshold energy. Application of at least a threshold amount of energy from an external source to a resistive state causes the material to switch to a conductive state. The conductive state persists as long as a minimum amount of external energy is provided to the material. Upon termination of the external energy, the material returns to a resistive state.

The instant devices include terminals for connecting the devices to other devices or external energy sources or sinks. The terminals may include input terminals for receiving electrical energy or signals from external devices or sources and providing it to the chalcogenide material as well as output terminals for delivering electrical energy or signals to external devices from the chalcogenide material. The instant devices may include one or more input terminals and one or more output terminals. The chalcogenide material, through its conductivity, determines the extent to which a signal provided to one terminal is transmitted to, communicated to or otherwise induces a signal in another terminal of the device. The conductivity and/or threshold of the chalcogenide material may be controlled by providing electrical energy to it in the form of a control signal from a control terminal. Alternatively, the conductivity and/or threshold of the chalcogenide material may be controlled by providing a control signal in the form of optical energy to it.

In one embodiment, a chalcogenide switching device having three or more terminals is provided where a control signal provided to a control terminal influences the conductivity and/or threshold voltage of the chalcogenide material between one or more pairs of non-control terminals.

In another embodiment, a chalcogenide switching device having three terminals in electrical communication with a chalcogenide material is provided where one terminal is an input terminal, another terminal is an output terminal and a third terminal is a control terminal. Depending on the conductivity of the chalcogenide material, an output signal may or may not be produced in response to an input signal. The conductivity of the chalcogenide material, for example, may control whether or not a signal is efficiently transmitted from the input terminal to the output terminal. Efficient signal transmission requires that the chalcogenide be in a conductive state. In this embodiment, the conductivity of the chalcogenide material between the input and output terminals may be influenced by providing an electrical control signal, such as a control voltage, to the control terminal. In the absence of a control signal, a voltage difference exceeding a threshold must be present between the input and output terminals in order for the chalcogenide material to switch from a resistive state to a conductive state. The threshold voltage depends on factors that include the chemical composition of the chalcogenide material and the distance between the input and output terminals. If the voltage difference between the input and output terminals is sub-threshold, the chalcogenide material remains in its resistive state and signal transmission between the input and output terminals is impeded. By applying a suitable control voltage at the control terminal in this embodiment, one can induce a switching of the chalcogenide material between the input and output terminals to a conductive state even when the voltage difference between the input and output terminals is below the threshold voltage. In this embodiment, application of a control voltage of a sufficient magnitude permits modulation of the threshold voltage between the input and output terminals.

In another embodiment, a chalcogenide switching device having two terminals in electrical communication with a chalcogenide material is provided where one terminal is an input terminal and another terminal is an output terminal. In this embodiment, a control signal is provided by an optical energy source. By applying a suitable optical control signal in this embodiment, one can induce a switching of the chalcogenide material between the input and output terminals to a conductive state even when the voltage difference between the input and output terminals is below the threshold voltage.

The instant switching devices can be linked to other devices to form a network. In a network, the instant switching devices may be used as interconnect devices to regulate the flow of electrical energy and signals between devices or circuit elements in the network.

DETAILED DESCRIPTION

The instant invention provides electronic switching devices based on chalcogenide materials. The switching properties of the chalcogenide materials are widely known and have been previously exploited in OTS (Ovonic Threshold Switch) devices. The OTS has been described in U.S. Pat. Nos. 5,543,737; 5,694,146; and 5,757,446; the disclosures of which are hereby incorporated by reference, as well as in several journal articles including "Reversible Electrical Switching Phenomena in Disordered Structures", Physical Review Letters, vol. 21, p.1450–1453 (1969) by S. R. Ovshinsky; "Amorphous Semiconductors for Switching, Memory, and Imaging Applications", IEEE Transactions on Electron Devices, vol. ED-20, p. 91–105 (1973) by S. R. Ovshinsky and H. Fritzsche; the disclosures of which are hereby incorporated by reference.

Figure 1:
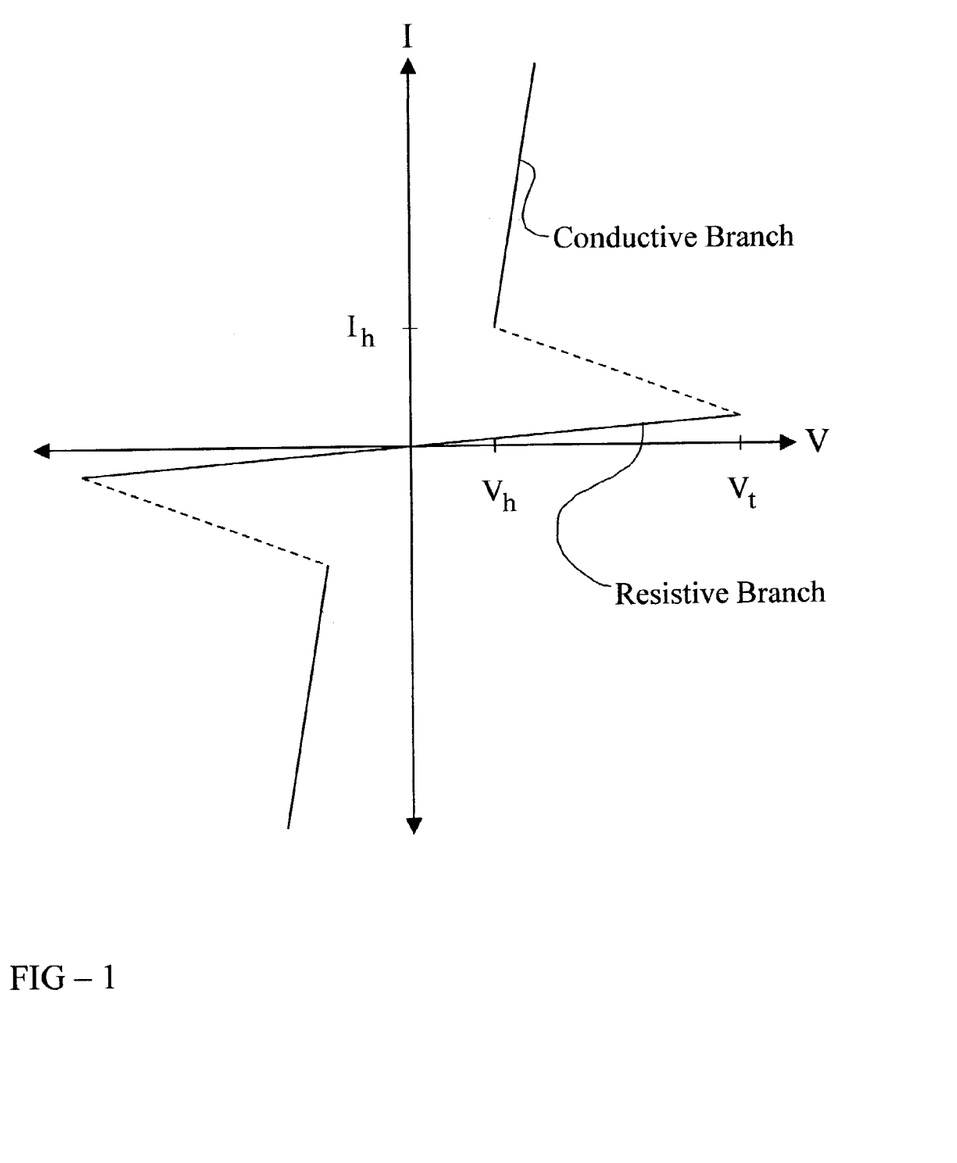
FIG. 1. I-V characteristics of a chalcogenide material exhibiting a switching transformation.

The electrical switching properties of the chalcogenide materials used in the instant devices are schematically illustrated in FIG. 1, which shows the I-V (current-voltage) characteristics of a chalcogenide switching material. The illustration of FIG. 1 corresponds to a two-terminal device configuration in which two spacedly disposed electrodes are in contact with a chalcogenide material and the current I corresponds to the current passing between the two electrodes. The I-V curve of FIG. 1 shows the current passing through the chalcogenide material as a function of the voltage applied across the material by the electrodes. The I-V characteristics of the material are symmetric with respect to the polarity of the applied voltage. For convenience, we consider the first quadrant of the I-V plot of FIG. 1 (the portion in which current and voltage are both positive) in the brief discussion of chalcogenide switching behavior that follows. An analogous description that accounts for polarity applies to the third quadrant of the I-V plot.

The I-V curve includes a resistive branch and a conductive branch. The branches are labeled in FIG. 1. The resistive branch corresponds to the branch in which the current passing through the material increases only slightly upon increasing the voltage applied across the material. This branch exhibits a small slope in the I-V plot and appears as a nearly horizontal line in the first and third quadrants of FIG. 1. The conductive branch corresponds to the branch in which the current passing through the material increases significantly upon increasing the voltage applied across the material. This branch exhibits a large slope in the I-V plot and appears as a nearly vertical line in the first and third quadrants of FIG. 1. The slopes of the resistive and conductive branches shown in FIG. 1 are illustrative and not intended to be limiting, the actual slopes will depend on the chemical composition of the chalcogenide material. Regardless of the actual slopes, the conductive branch necessarily exhibits a larger slope than the resistive branch. When device conditions are such that the chalcogenide material is described by a point on the resistive branch of the I-V curve, the chalcogenide material or device may be said to be in a resistive state. When device conditions are such that the chalcogenide material is described by a point on the conductive branch of the I-V curve, the chalcogenide material or device may be said to be in a conductive state.

The switching properties of the chalcogenide material used in the instant switching devices can be described by reference to FIG. 1. We consider a two-terminal device configuration and begin with a device that has no voltage applied across it. When no voltage is applied across the chalcogenide material, the material is in a resistive state and no current flows. This condition corresponds to the origin of the I-V plot shown in FIG. 1. The chalcogenide remains in a resistive state as the applied voltage is increased, up to a threshold voltage (labeled $V_t$ in the first quadrant of FIG. 1). The slope of the I-V curve for applied voltages between 0 and $V_t$ is small in magnitude and indicates that the chalcogenide material has a high electrical resistance, a circumstance reflected in the terminology "resistive branch" used to describe this portion of the I-V curve. The high resistance implies low electrical conductivity and as a result, the current flowing through the material increases only weakly as the applied voltage is increased. Since the current through the material is very small, the resistive state of the chalcogenide may be referred to as the OFF state of the material.

When the applied voltage equals or exceeds the threshold voltage, the chalcogenide material transforms (switches) from the resistive branch to the conductive branch of the I-V curve. The switching event occurs instantaneously and is depicted by the dashed line in FIG. 1. Upon switching, the device voltage decreases significantly and the device current becomes much more sensitive to changes in the device voltage. The chalcogenide material remains in the conductive branch as long as a minimum current, labeled $I_h$ in FIG. 1, is maintained. We refer to $I_h$ as the holding current and the associated voltage $V_h$ as the holding voltage of the device. If the device conditions are changed so that the current becomes less than $I_h$, the material normally returns to the resistive branch of the I-V plot and requires re-application of a threshold voltage to resume operation on the conductive branch. If the current is only momentarily (a time less than the recovery time of the chalcogenide material) reduced below $I_h$, the conductive state of the chalcogenide may be recovered upon restoring the current to or above $I_h$. The recovery time of chalcogenide materials has been discussed in the article "Amorphous Semiconductors for Switching, Memory, and Imaging Applications" incorporated by reference hereinabove.

Analogous switching behavior occurs in the third quadrant of the I-V plot shown in FIG. 1. Provided one is cognizant of the negative polarity of the I-V curve in the third quadrant, the switching behavior in the third quadrant is analogous to that described hereinabove for the first quadrant. For example, applied voltages having a magnitude greater than the magnitude of the negative threshold voltage in the third quadrant induce switching from the resistive branch to the conductive branch.

The switching effect of the instant devices originates from a transformation of the chalcogenide material from a resistive state to a conductive state upon application of a threshold voltage, $V_{th}$. A model can be used to describe the phenomenon underlying the switching transformation. According to the model, application of the threshold voltage causes the formation of a conductive channel or filament within the chalcogenide material. At the threshold voltage, the electric field experienced by the material is sufficiently high to induce a breakdown or avalanche effect whereby electrons are removed from atoms to form a highly conductive, plasma-like filament of charge carriers. Rather than being bound to atoms, some electrons become unbound and highly mobile. As a result, a conductive channel or filament forms. The conductive filament constitutes a conductive volume within the otherwise resistive chalcogenide material. The conductive filament extends through the chalcogenide material between the device terminals and provides a low resistance pathway for electrical current. Portions of the chalcogenide material outside of the filament remain resistive. Since electric current traverses the path of least resistance, the presence of a conductive filament renders the chalcogenide material conductive and establishes a conductive state. The creation of a conductive filament is the event that underlies the switching of the chalcogenide material from a resistive state to a conductive state.

The conductive filament is maintained between the device terminals as long as the device current remains at or above the holding current. A conductive filament is present for all points along the conductive branch, but the cross sectional area of the filament differs for different points along the conductive branch. The cross sectional area of the filament refers to directions lateral to the direction of current flow. Depending on operating conditions within the conductive branch, the filament can be narrow or wide. As the applied voltage is increased along the conductive branch, the cross section of the filament is enlarged as the applied voltage is increased. The enlarged filament indicates a greater volume of the chalcogenide material exhibits high conductivity. As a result, the chalcogenide material can support a greater current, as indicated by the conductive branch of the I-V curve, as the applied voltage increases. Variations of the voltage applied to a chalcogenide material operating in the conductive branch modify the width or thickness of the filament in directions lateral to the direction of current flow. The net effect of varying the applied voltage of a chalcogenide material operating in the conductive branch is to modify the volume fractions of the conductive and resistive portions.

Chalcogenide materials of many chemical compositions undergo the foregoing switching effect. Representative chalcogenide materials are those that include one or more elements from column VI of the periodic table (the chalcogen elements) and optionally one or more chemical modifiers from columns III. IV or V. One or more of S, Se, and Te are the most common chalcogen elements included in the active material of the instant devices. The chalcogen elements are characterized by divalent bonding and the presence of lone pair electrons. The divalent bonding leads to the formation of chain and ring structures upon combining chalcogen elements to form chalcogenide materials and the lone pair electrons provide a source of electrons for forming a conducting filament. Trivalent and tetravalent modifiers such as Al, Ga, In, Ge, Sn, Si, P, As and Sb enter the chain and ring structures of chalcogen elements and provide points for branching and crosslinking. The structural rigidity of chalcogenide materials depends on the extent of crosslinking and leads to a broad classification of chalcogenide materials, according to their ability to undergo crystallization or other structural rearrangements, into one of two types: threshold materials and memory materials.

Both types of chalcogenide materials display the switching behavior shown in FIG. 1, but differ in their structural response to filament formation. Threshold materials generally possess a higher concentration of modifiers and are more highly crosslinked than memory materials. They are accordingly more rigid structurally. Threshold materials are amorphous and show little or no tendency to crystallize because the atomic rearrangements required to nucleate and grow a crystalline phase are inhibited due to the rigidity of the structure. Threshold materials remain amorphous upon removing the applied voltage after switching.

Memory materials, on the contrary, are lightly crosslinked and more easily undergo full or partial crystallization. An amorphous memory material undergoes filament formation in the presence of a threshold voltage as described in FIG. 1 hereinabove. Once in the conductive branch, however, the memory material may undergo nucleation and growth of a crystalline phase. The volume fraction of the crystalline phase depends on the magnitude and time of the current passing through the memory material. The crystalline phase is retained upon removing the applied voltage after switching. Through appropriate selection of device operating conditions, the amorphous-crystalline transformation of chalcogenide memory materials becomes reversible over many cycles. Chalcogenide memory materials have been discussed in U.S. Pat. Nos. 5,166,758; 5,296,716; 5,534,711; 5,536,947; 5,596,522; and 6,087,674; the disclosures of which are hereby incorporated by reference.

The instant devices improve upon the prior art two-terminal devices by providing multi-terminal devices with which it is possible to control the operating conditions required to induce switching and filament formation in a desired location within a chalcogenide material. Some embodiments of the instant devices include one or more input terminals, one or more output terminals, and one or more control terminals in electrical communication with a chalcogenide material. In the instant devices, a suitable control signal at the control terminal influences the conductivity or threshold switching voltage of the chalcogenide material between a first terminal of the device and a second terminal of the device. In the absence of a control signal, the chalcogenide material switches from a resistive state to a conductive state upon application of a threshold voltage, where the magnitude of the threshold voltage corresponds to the threshold voltage between the first and second terminals in the corresponding two-terminal device configuration. The presence of a suitable control signal at the control terminal of the instant multi-terminal devices permits modulation of the threshold voltage between the first and second terminals to a magnitude different from that obtained in the corresponding two-terminal device configuration. Also, when a sub-threshold voltage is applied between a first terminal and a second terminal of the instant devices, application of a control signal may vary the conductivity of the chalcogenide material between the two terminals by inducing a transformation of the chalcogenide material from a resistive state to a conductive state. As a result, high conductivity may be achieved between one terminal and another terminal even when the voltage applied between the two terminals is below the threshold voltage of the corresponding two terminal device. In these embodiments, the control signal may be an electrical signal such as a current or voltage.

In other embodiments of the instant invention, the control signal is an optical signal. Devices according to these embodiments include a first terminal and a second terminal in electrical communication with a chalcogenide material, wherein an optical control signal provided by an optical source is used to control the conductivity or threshold voltage of the chalcogenide material between the first and second terminals. The optical control signal provides energy to the chalcogenide material and may be applied to selected portions of the chalcogenide material or to the whole of the chalcogenide material. Suitable optical sources include incandescent lights, lasers, diodes, light provided by optical fibers or waveguides or light provided by optical chalcogenide materials, including those that contain Se. Optical sources operating in continuous mode or pulsed mode are within the scope of the instant invention.

Figure 2:
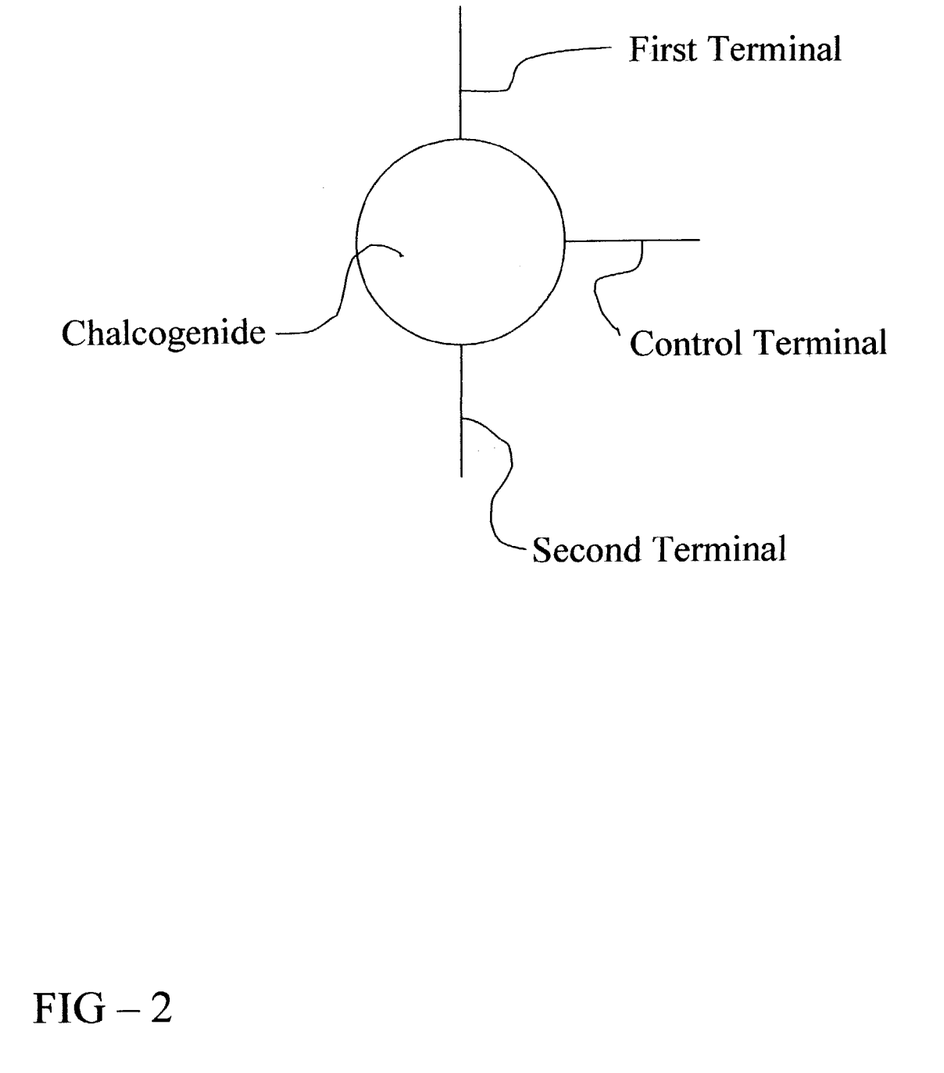
FIG. 2. Schematic depiction of a generic three-terminal chalcogenide device according to the instant invention.

One embodiment of the instant devices is a three terminal device having a first terminal, a second terminal and a control terminal in electrical communication with a chalcogenide material. A schematic depiction of this embodiment is presented in FIG. 2. In this embodiment, the control terminal may be used to modulate the conductivity of the chalcogenide material between the first and second terminals or to modulate the threshold voltage that must be applied between the first and second terminals to induce a transformation of the chalcogenide material from a resistive state to a conductive state. The first and second terminals may also be referred to herein as non-control terminals, input and/or output terminals, or load and reference terminals. Terminals may also be referred to as electrodes and may include terminals containing a single layer or chemical composition as well as terminals comprising two or more layers.

In some embodiments of the instant invention, the electrical communication between a terminal and the chalcogenide material of the instant devices is direct, whereby an electric current propagates from the terminal to the chalcogenide material. In other embodiments of the instant invention, the electrical communication between a terminal and the chalcogenide material of the instant devices is indirect, whereby an electrical effect at the terminal (such as a potential or field) influences the chalcogenide material without passage of an electrical current.

In one embodiment, a terminal includes a conductive material in contact with a barrier material where the barrier material is in contact with the chalcogenide material of the device. In another embodiment, a terminal includes a conductive material and a barrier material where electrical communication between the conductive material and chalcogenide material occurs through the barrier material. In still another embodiment, a terminal includes a chalcogenide material disposed between two conductive materials where one of the conductive materials is in electrical communication with the working chalcogenide material of the instant devices. In this embodiment, the terminal may be a two-terminal chalcogenide device, such as an Ovonic Threshold Switch, where the conductivity of the terminal is controlled by the resistivity of the chalcogenide material included in the terminal. A memory type chalcogenide material may also be used. In these embodiments, the terminal can be resistive or conductive and thereby control access of a control signal or input signals to the working chalcogenide of the instant devices. In yet another embodiment, a terminal may be a field effect electrode that includes a thin dielectric layer interposed between a conductive material and the working chalcogenide. Principle of operation of such an electrode is similar to that of a gate electrode in a MOSFET. The dielectric layer inhibits the flow of current from the conductive material to the working chalcogenide, but is sufficiently thin to allow electric fields present in the conductive material- to influence the chalcogenide material.

Analogous embodiments having more than three terminals are also within the scope of the instant invention. In these embodiments, devices having a plurality of input, output and/or control terminals are within the scope of the instant invention. Preferred embodiments of the instant invention are those in which different terminals are electrically isolated from one another in the sense that electrical communication or signal transmission between any pair of terminals occurs through the chalcogenide material. Electrical communication and signal transmission include the communication or transmission of electrical effects such as charges, currents or voltages. Electrical isolation may occur, for example, by separating electrodes with an insulating material or by otherwise spacedly disposing the electrodes.

EXAMPLE 1

Figure 3:
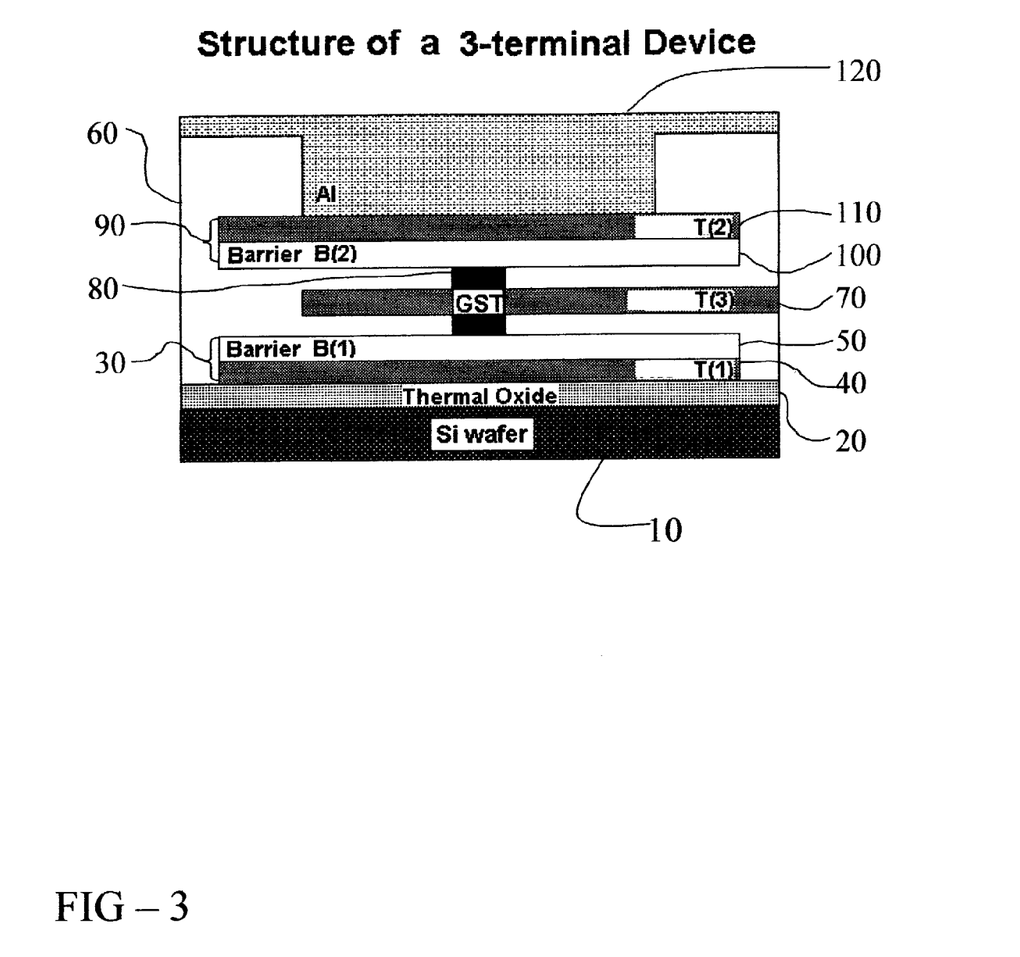
FIG. 3. Schematic depiction of an embodiment of a three-terminal chalcogenide device according to the instant invention.

An example of a device structure according to the instant invention is shown in FIG. 3. FIG. 3 shows a cross-sectional view of a three terminal device structure. The three terminals are labeled T(1), T(2), and T(3). A plurality of these devices was formed on a 6" silicon wafer. The devices and layers on the wafer were formed using conventional sputtering, chemical vapor deposition, etching, and lithography techniques. The structure includes a silicon wafer substrate 10, a thermal oxide layer 20, a bottom electrode 30 that includes a conductive layer 40 formed from TiW or a combination of Ti and TiN and a carbon barrier layer 50, an $SiO_x/SiN_x$ insulating region 60, a control electrode 70 formed from TiW, a chalcogenide material 80, a top electrode 90 that includes a carbon barrier layer 100 and a conductive layer 110 that includes Ti and TiN, and an Al layer 120. In this example, the chalcogenide material 80 is $Ge_2Te_2Sb_5$ and is labeled GST in FIG. 3. The barrier layers inhibit diffusion and electromigration of material into the chalcogenide region and improve the cycle life of the device. Typical layer thicknesses are as follows: conductive layer 40 (100 nm), barrier layer 50 (30 nm), control electrode 70 (10–40 nm), barrier layer 100 (100 nm), and conductive layer 110 (100 nm). The region occupied by the chalcogenide material in device of this example is cylindrical with a height of approximately 0.1 micron and a diameter of about 1 micron. The region occupied by the chalcogenide material may be referred to herein as a pore, pore region or the like. The electrodes 30, 70 and 90 are in electrical communication with the chalcogenide and correspond to the terminals indicated in the depiction of FIG. 2. The control electrode 70 circumscribes the chalcogenide material 80. The top electrode 90 and bottom electrode 30 may also be referred to as the load and reference electrodes, respectively. In a preferred embodiment, the reference electrode is at ground. The electrodes are separated by insulating material so that electrical communication between electrodes occurs through the chalcogenide material.

EXAMPLE 2

Figure 4:
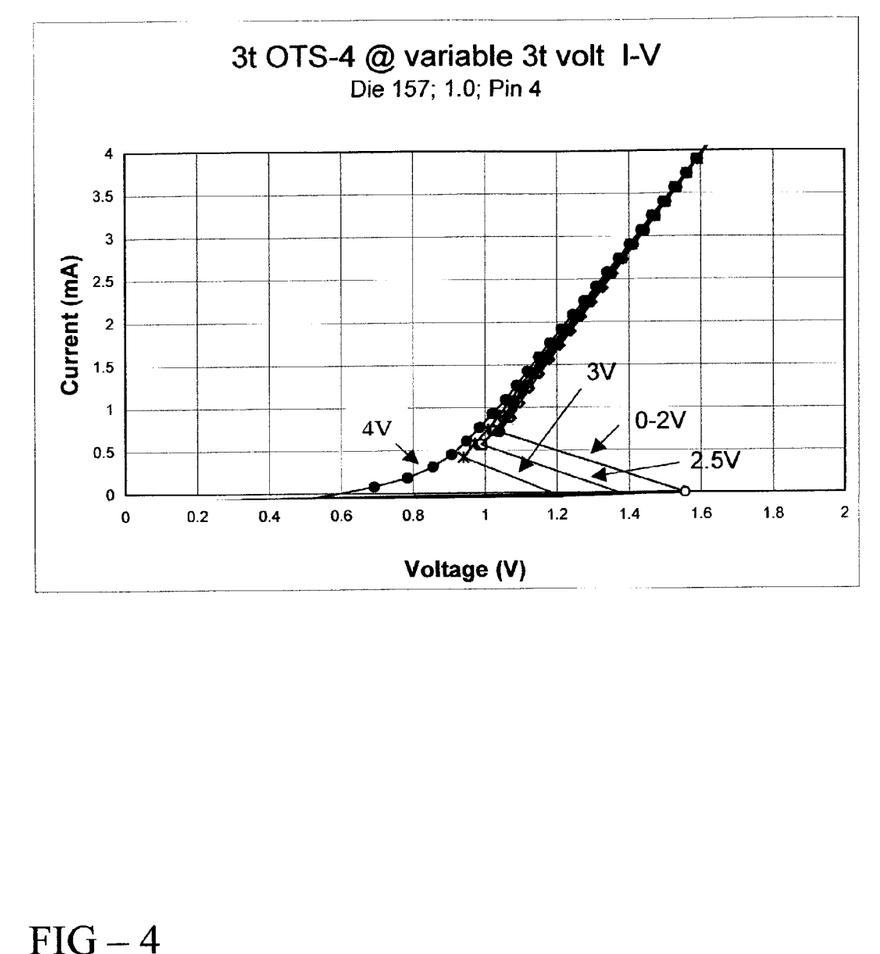
FIG. 4. I-V characteristics of the three-terminal device illustrated in FIG. 3.

In this example, the results of several tests of the properties of the three terminal device structure shown in FIG. 3 are described. Tests were completed on several different devices selected randomly from the devices formed on a wafer. FIG. 4 summarizes the results of some of the tests completed by the instant inventors. FIG. 4 shows the first quadrant of an I-V plot for the instant three terminal device. The current I corresponds to the current passing between the load (top) and reference (bottom) electrodes of the structure and the voltage V corresponds to the voltage applied between the load and reference electrodes. The I-V relationship between the load and reference electrodes was determined for several different control voltages applied to the control electrode. In the tests, a control voltage of constant magnitude was applied to the control terminal and the current between the load and reference electrodes was measured as a function of the voltage applied between the load and reference electrodes. The control voltage was applied in the form of a long duration voltage pulse (e.g. 3 microseconds) and the voltage between the load and reference electrodes was applied in the form of a short duration pulse (e.g. 100 nanoseconds) while the control voltage was being applied. In this example, the control voltage is applied between the control electrode and reference electrode of the device.

The data in FIG. 4 indicate that application of a control voltage to the control electrode may be used to modulate the threshold voltage between the load and reference electrodes. The different I-V curves correspond to tests using different control voltages. The control voltage associated with each I-V curve is indicated with a label in FIG. 4. The I-V curve labeled "0–2V" shows the behavior of the device for control voltages between 0 V and 2 V, inclusive. Since the I-V characteristics of the device are substantially identical for control voltages in this range, a single curve is presented for the several tests completed in this voltage range. The "0–2V" data indicate that the resistive branch of the I-V curve extends from an applied voltage of 0 V up to a voltage threshold voltage of about 1.56 V. Once the threshold voltage is reached, the device switches to the conductive branch. As discussed in FIG. 1 above, the switching transformation is indicated by a negatively sloping line in the I-V curve.

When the control voltage is increased above 2 V, a decrease in the threshold voltage is observed. The I-V curve labeled "2.5V" indicates that a control voltage of 2.5 V reduces the threshold voltage by over 10% to a value slightly below 1.4 V. A further increase of the control voltage to 3 V leads to a decrease in the threshold voltage of about 25% to a value of about 1.2 V. When a control voltage of 4 V is applied, the threshold voltage is effectively eliminated and the chalcogenide material between the load and reference electrodes is in its conductive state over the full range of applied voltages tested.

The test data presented in FIG. 4 demonstrate an ability to modulate the threshold voltage between two electrodes of a multi-terminal device by applying a control voltage to a control terminal. The modulation effect represents functionality achievable in the instant multi-terminal devices that is not available in standard two-terminal devices.

While not wishing to be bound by theory, the instant inventors believe that application of a control signal of sufficient magnitude to a control terminal may facilitate formation of a conductive filament between two non-control terminals of a multi-terminal device. Facilitation of filament formation is manifested as a decrease in the magnitude of the threshold voltage required to switch the chalcogenide material between two non-control terminals (e.g. input and output terminals, two input terminals, two output terminals, load and reference terminals etc.) to a conductive state. The minimum control signal required to facilitate filament formation may be referred to as a critical control signal. In EXAMPLE 2 hereinabove, for example, the critical control voltage is a voltage between 2 V and 2.5 V.

It is believed by the instant inventors that the critical control signal is the minimum signal required to form a filament within the chalcogenide material between the control terminal and a non-control terminal. In the EXAMPLE 2, the critical control voltage is believed to form a filament between the control terminal and the reference terminal of the device. The presence of this filament is believed to alter the chalcogenide material in such a way that the threshold voltage required to form a filament between the load and reference electrodes is reduced. The presence of a conductive filament between the control and reference electrodes may produce electric fields or potentials within the chalcogenide material that lower the energy required to form filaments in other portions of the chalcogenide material.

As the control signal is raised above the critical value, the cross-section of the filament between the control electrode and reference electrode is believed to increase and a greater volume of the chalcogenide material is believed to be influenced by the control signal. In EXAMPLE 2, the decrease in the threshold voltage between the load and reference electrodes with increasing control voltage may be due to an enlargement of a filament between the control and reference electrodes. Enlargement of this filament implies that the filament boundary becomes closer in proximity to the load electrode. The closer proximity suggests that a smaller electric field, and hence a smaller threshold voltage, is required to establish a filament between the load and reference electrodes. A filament may form, for example, between the load and reference electrodes through a branching of the filament present between the control and reference electrodes. In such a branching process, a portion of a filament between the load and reference electrodes exists within the filament present between the control and reference electrodes and the voltage required to complete the filament may be that required to form a filament between the load electrode and some point, a branching point, along the existing filament. Since the distance between the load electrode and a branching point of an existing filament is likely to be smaller than the distance between the load and reference electrodes, the magnitude of the electric field or voltage required to complete a filament to the load electrode is reduced. At some control signal sufficiently above the critical control signal, it may be expected that the filament formed between the control electrode and the reference electrode is sufficiently enlarged that the boundary of the filament overlaps or makes contact with the load electrode. When this occurs, it is believed that the threshold voltage between the load and reference electrodes decreases to zero. Although speculative at this time, this model is consistent with the data presented in FIG. 4.

In addition to modulating the threshold voltage between two terminals, the instant multi-terminal devices may be used to modulate the conductivity of the chalcogenide material between two terminals. This capability can be demonstrated using the representative device structure shown in FIG. 3 and the data shown in FIG. 4. As an example, consider the application of a voltage of 1.5 V between the load and reference electrodes in the absence of a control voltage. As shown in FIG. 4, application of a voltage of 1.5 V between the load and reference electrodes is unable to switch the device because 1.5 V is a sub-threshold voltage. The chalcogenide material between the load and reference electrodes therefore remains in a resistive state and the conductivity between the load and reference electrodes is poor.

By applying a control voltage of sufficient magnitude while maintaining a sub-threshold voltage between the load and reference electrodes, it becomes possible to effect a switching event between the load and reference electrodes and thereby to induce a pronounced increase in the conductivity of the chalcogenide material between the load and reference electrodes. In the case in which a sub-threshold voltage of 1.5 V is applied between the load and reference electrodes, control voltages between 0 V and 2 V do not decrease the threshold voltage or influence the conductivity of the chalcogenide material between the load and reference electrodes. A control voltage of 2.5 V, however, decreases the threshold voltage to below 1.5 V thereby inducing a transformation of the chalcogenide material between the load and reference electrodes from a resistive state to a conductive state. The transformation is accompanied by a decrease in the voltage between the load and reference electrodes along with an increase in current. The voltage between the load and reference electrodes decreases to a voltage at or above the holding voltage. Whereas the device is resistive and inhibits signal transmission between the load and reference electrodes in the absence of a control signal, the device becomes conductive and more readily transmits signals when a control voltage of sufficient magnitude is provided. An appropriate control signal may therefore be used to increase the conductivity of the chalcogenide material between two non-control electrodes when a sub-threshold voltage is present therebetween. The conductivity of the chalcogenide material between two non-control electrodes may analogously be increased by removing or decreasing the magnitude of the control signal applied to the control terminal. Judicious control of the timing, duration and/or magnitude of a control signal may thus be used to modulate the conductivity of the chalcogenide material between two non-control terminals.

Corresponding embodiments that include more than three terminals are also within the scope of the instant invention. In these embodiments, any terminal may function as a control terminal with respect to any two non-control terminals. Consider as an example a four-terminal chalcogenide device where the terminals are labelled 1, 2, 3, and 4. Terminal 1 may function as a control terminal for terminals 2 and 3, 2 and 4 or 3 and 4. Factors such as the relative proximity of terminal 1 to terminals 2, 3, and 4 and the voltages present at terminals 2, 3, and 4 influence the pair of terminals between which terminal 1 modulates the threshold voltage or conductivity of the chalcogenide material. If, for example, a voltage near the threshold voltage is present between terminals 2 and 3, while no voltage is present between terminals 2 and 4, a control signal provided by terminal 1 is more likely to modulate the threshold voltage or conductivity between terminals 2 and 3 rather than between terminals 2 and 4. Under suitable conditions, it may also be possible for terminal 1 to modulate the threshold voltage or conductivity of chalcogenide material between more than one pair of terminals within the group of terminals 2, 3, and 4. It may also be possible to provide control signals to two terminals. Control signals to terminals 1 and 2, for example, may modulate the threshold voltage or conductivity of chalcogenide material between terminals 3 and 4. Analogous arguments hold for embodiments having more than four terminals.

Multi-terminal embodiments of the instant devices include devices having more than one control terminal and operating under the influence of more than one control signal. Multiple control signals may be electrical signals, optical signals or a combination of electrical and optical signals.

The terminals of the instant devices may be located in various spatial configurations. All terminals, for example, may be in a common plane or layer or two-dimensional circuit. Alternatively, one or more terminals may be positioned outside of a plane in which other terminals reside. A three terminal device according to the instant invention, for example, may have two terminals and a chalcogenide material in a common horizontal layer and a third terminal vertically disposed relative to that layer. Such a configuration provides for a vertical interconnection capability. Analogous embodiments for devices having more than three terminals are also within the scope of the instant invention.

The instant devices may be combined with other devices or elements to form circuits or networks. In one embodiment, the instant devices may be used as interconnection devices between two or more elements. In this embodiment, the conductivity of the chalcogenide material present in the instant device influences the electrical communication between two or more elements connected to the instant device. A schematic depiction of this embodiment is presented in FIG. 5 which shows a circuit or network element 200 coupled to a circuit or network element 210 through a three-terminal chalcogenide interconnection device 220. The interconnection device 220 includes interconnection terminals 230 and 240, control terminal 250 in electrical communication with chalcogenide material 260. The elements 200 and 210 may be single devices such as transistors, diodes, silicon devices, other chalcogenide devices or circuits or networks comprising a plurality of devices. One of the elements may also be a ground.

Figure 5:
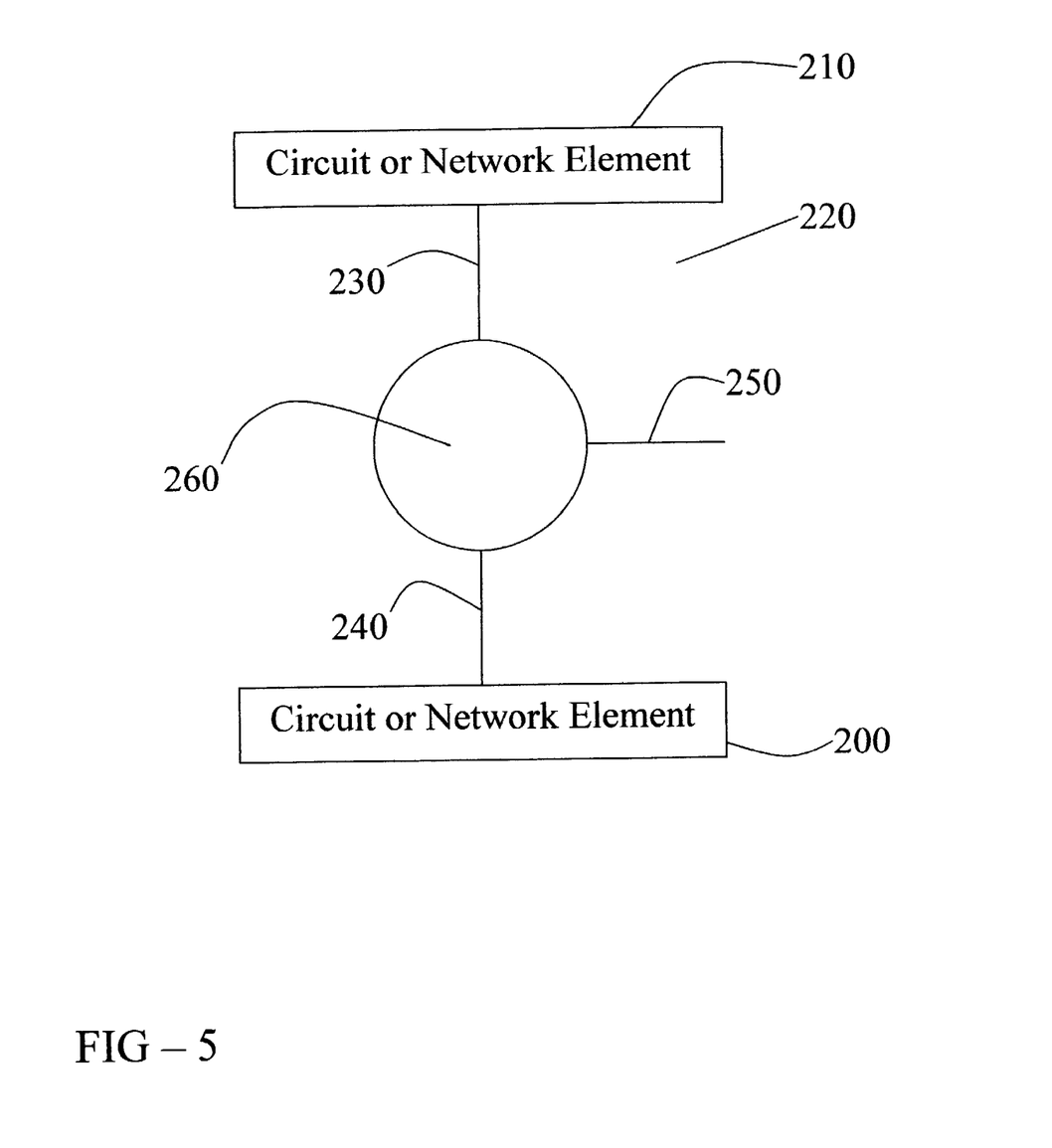
FIG. 5. Utilization of a three-terminal chalcogenide device as an interconnection device between two circuit or network elements.

Application of a control signal to the control terminal of the interconnection device 220 modulates the conductivity of the chalcogenide material between interconnection terminals 230 and 240, thereby providing a means for controlling the extent of electrical communication or signal transmission between elements 200 and 210. When the chalcogenide material 260 is in a resistive state, the conductivity of the interconnection device 220 is low and signal transmission from element 200 to element 210 (or vice versa) is poor or non-existent. The elements 200 and 210 are substantially electrically isolated from each other so that, for example, currents or voltages generated by one of the two elements is substantially not sensed by or substantially does not influence the behavior of the other of the two elements. When the chalcogenide material 260 is in a conductive state, the conductivity of the interconnection device 220 is high and signal transmission from element 200 to element 210 (or vice versa) is good. Electrical voltages or currents produced by one of the two elements are readily communicated to the other of the two elements.

As described hereinabove, the state of conductivity of the chalcogenide material 260 may be influenced by applying a suitable control signal to the control terminal 250. A control signal may induce a transformation of the chalcogenide material from a resistive state to a conductive state thereby enabling signal transmission and electrical communication between interconnected elements 200 and 210. The magnitude of the control signal required to induce the switching transformation depends on the voltage difference present between the two interconnection terminals 230 and 240. The greater the voltage difference is, the smaller in magnitude is the necessary control signal. Removal of a control signal or presence of a control signal of insufficient magnitude may be unable to induce a switching transformation, thereby producing or maintaining the chalcogenide material in a resistive state and inhibiting signal transmission or electrical communication between elements 200 and 210. Corresponding embodiments having more than three terminals in which a control terminal modulates the threshold voltage or conductivity of chalcogenide material between one or more pairs of non-control terminals are also within the scope of the instant invention.

Figure 6:
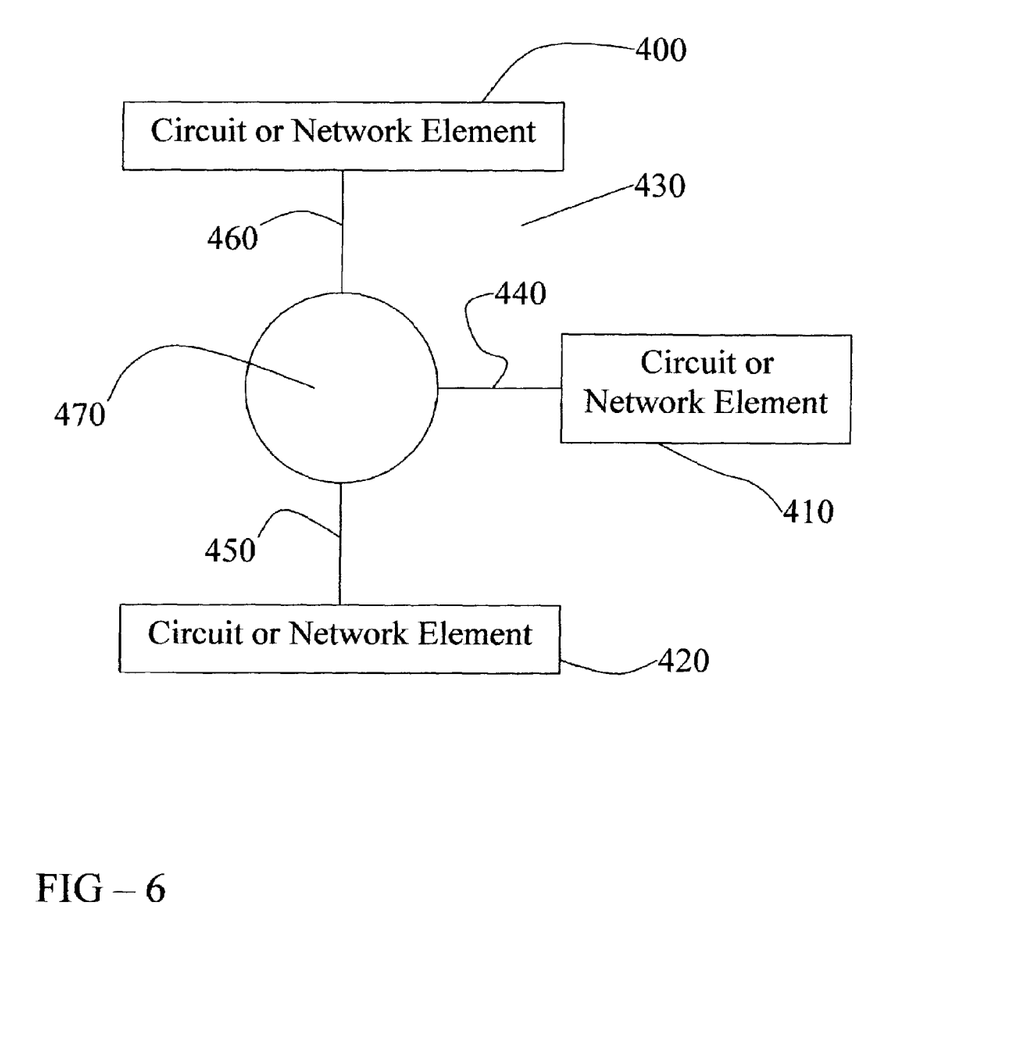
FIG. 6. Utilization of a three-terminal chalcogenide device as an interconnection device between three circuit or network elements.

In another embodiment, a three-terminal chalcogenide device is used to interconnect three circuit or network elements as shown in FIG. 6. In this embodiment, circuit or network elements 400, 410 and 420 are interconnected to each other through a three-terminal interconnection device 430 that includes interconnection terminals 440, 450 and 460 in electrical communication with chalcogenide 470. In this embodiment, any of the three interconnection terminals may be used as a control terminal for modulating the threshold voltage or conductivity of the chalcogenide material between the other two interconnection terminals. As an example, a signal provided by element 410 through interconnection terminal 440 may be used as a control signal with respect to the threshold voltage or conductivity of the chalcogenide material between interconnection terminals 450 and 460, thereby providing for modulation or control of signal transmission or electrical communication between elements 400 and 420. Element 400 and interconnection terminal 460 may similarly be used with respect to elements 410 and 420. Element 420 and interconnection terminal 450 may similarly be used with respect to elements 400 and 410. In this embodiment, the magnitude of a control signal is determined by the signal produced by a circuit or network element. Corresponding embodiments in which chalcogenide devices with more than three terminals are used to interconnect more than three circuit or network elements are also within the scope of the instant invention.

Although the schematic depictions of FIGS. 5 and 6 indicate interconnection of circuits or network elements in a two-dimensional configuration, interconnection in three-dimension is also within the scope of the instant invention. One or more terminals may be vertically disposed or otherwise non-co-planar with the chalcogenide material or other terminals. A control signal, for example, may be provided from a terminal or device orthogonal to a plane in which a chalcogenide material may reside.

In other embodiment, the instant multi-terminal devices may provide signals to other devices or elements in circuits or networks. As described hereinabove, when a sub-threshold voltage is applied between two terminals (e.g. load and reference terminals) of a chalcogenide device, it is possible to induce a switching of the chalcogenide material between those two terminals through application of a control signal provided by a control terminal in electrical communication with the chalcogenide material. The switching is accompanied by a decrease in the magnitude of the voltage and an increase in the magnitude of the current between the load and reference terminals. These changes in voltage and current may be used as input signals to other devices or elements in a circuit or network. As an example, consider the device arrangement described in FIG. 5 hereinabove where the voltage across interconnection terminals 230 and 240 is a sub-threshold voltage and the chalcogenide material is in a resistive state. If a control signal of critical magnitude is subsequently applied to the control terminal 250, a switching of the chalcogenide material between interconnection terminals 230 and 240 to a conductive state occurs. The switching is accompanied by voltage and current changes between interconnection 230 and 240, as described hereinabove, and these voltage and current changes may be provided as input or driving signals to element 210 and/or element 200. The principles and modes of operation described herein for three-terminal embodiments of the instant invention extend analogously to multi-terminal devices having more than three terminals.

The disclosure and discussion set forth herein is illustrative and not intended to limit the practice of the instant invention. Numerous equivalents and variations thereof are envisioned to be within the scope of the instant invention. It is the following claims, including all equivalents, in combination with the foregoing disclosure, which define the scope of the instant invention.

We claim:

1. An electronic switching device comprising:
   a first terminal;
   a second terminal;
   a third terminal; and
   a chalcogenide material in electrical communication with said first terminal, said second terminal and said third terminal, wherein said third terminal is a control terminal and application of a control signal to said control terminal modulates the conductivity of said chalcogenide material between said first terminal and said second terminal.

2. The device of claim 1, wherein said control signal is a voltage or a current.

3. The device of claim 2, wherein said control signal is provided in the form of a voltage pulse or a current pulse.

4. The device of claim 1, wherein said control signal is provided by a chalcogenide material.

5. The device of claim 1, wherein electrical communication between any two of said first terminal, said second terminal or said third terminal occurs through said chalcogenide material.

6. The device of claim 1, wherein said chalcogenide material has a resistive state and a conductive state, said chalcogenide material transforming from said resistive state to said conductive state when subjected to a voltage having a magnitude that exceeds a threshold voltage, said chalcogenide material having a first threshold voltage between said first terminal and said second terminal and a second threshold voltage between said control terminal and said first terminal.

7. The device of claim 6, wherein said control signal modulates said first threshold voltage.

8. The device of claim 7, wherein the magnitude of said first threshold voltage is reduced.

9. The device of claim 8, wherein said reduction is at least 10%.

10. The device of claim 8, wherein said reduction is at least 25%.

11. The device of claim 6, wherein application of said control signal causes the magnitude of the voltage difference between said control terminal and said first terminal to exceed the magnitude of said second threshold voltage.

12. The device of claim 1, wherein said first terminal, said second terminal and said third terminal comprise a conductive material.

13. The device of claim 12, wherein at least one of said terminals further comprises a baffler material.

14. The device of claim 12, wherein at least one of said terminals further comprises a chalcogenide material.

15. The device of claim 1, wherein at least one of said first terminal, said second terminal and said third terminal is a field effect electrode.

16. The device of claim 1, wherein said first terminal, said second terminal and said third terminal are in direct electrical communication with said chalcogenide material.

17. The device of claim 1, wherein said chalcogenide material comprises an element selected from the group consisting of S, Se, and Te.

18. The device of claim 17, wherein said chalcogenide material further comprises Ge or Sb.

19. The device of claim 17, wherein said chalcogenide material further comprises As or Si.

20. The device of claim 17, wherein said chalcogenide material further comprises an element selected from the group consisting of Al, In, Bi, Pb, Sn, P, and O.

21. The device of claim 17, wherein said chalcogenide further comprises a transition metal.

22. The device of claim 1, wherein said first terminal, said second terminal and said third terminal are not co-planar.

23. The device of claim 1, further comprising one or more additional terminals in electrical communication with said chalcogenide material.

24. A circuit comprising a first element, a second element and an interconnection element, said interconnection element controlling the electrical communication between said first and second elements, said interconnection element comprising the device of claim 1, said first element being in electrical communication with said first terminal, said second element being in electrical communication with said second terminal.

25. The circuit of claim 24, further comprising a third element, said third element being in electrical communication with said third terminal of said interconnection element.

26. The circuit of claim 24, wherein said interconnection element provides a signal to one of said first element or said second element, said signal being produced when said chalcogenide material of said interconnection element transforms from a resistive state to a conductive state or from a conductive state to a resistive state.

27. An electronic switching device comprising:
a first terminal;
a second terminal;
a chalcogenide material in electrical communication with said first and second terminals; and an optical source, said optical source providing an optical control signal to said chalcogenide material, said optical control signal modulating the conductivity or threshold voltage of said chalcogenide material between said first and second terminals.

28. The device of claim 27, wherein said optical source is a laser.

29. The device of claim 27, wherein said optical source comprises an optical chalcogenide material, said optical chalcogenide material providing said optical control signal.

30. The device of claim 29, wherein said optical chalcogenide material comprises Se.

* * * * *